United States Patent
Onishi et al.

(10) Patent No.: US 9,548,182 B2
(45) Date of Patent: Jan. 17, 2017

(54) CHARGED PARTICLE BEAM GENERATING APPARATUS, CHARGED PARTICLE BEAM APPARATUS, HIGH VOLTAGE GENERATING APPARATUS, AND HIGH POTENTIAL APPARATUS

(71) Applicant: HITACHI HIGH-TECHNOLOGIES CORPORATION, Tokyo (JP)

(72) Inventors: Takashi Onishi, Tokyo (JP); Shunichi Watanabe, Tokyo (JP); Minoru Kaneda, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/406,909

(22) PCT Filed: May 8, 2013

(86) PCT No.: PCT/JP2013/062896
§ 371 (c)(1),
(2) Date: Dec. 10, 2014

(87) PCT Pub. No.: WO2013/187155
PCT Pub. Date: Dec. 19, 2013

(65) Prior Publication Data
US 2015/0179387 A1     Jun. 25, 2015

(30) Foreign Application Priority Data
Jun. 11, 2012  (JP) ................................. 2012-132103

(51) Int. Cl.
*H01J 37/04*     (2006.01)
*H01J 37/073*    (2006.01)
(Continued)

(52) U.S. Cl.
CPC .............. *H01J 37/04* (2013.01); *H01J 27/024* (2013.01); *H01J 29/485* (2013.01); *H01J 37/026* (2013.01);
(Continued)

(58) Field of Classification Search
None
See application file for complete search history.

(56) References Cited

U.S. PATENT DOCUMENTS 3,484,866 A * 12/1969 Kawai ................... H05H 5/045
307/110
3,895,254 A * 7/1975 Minamikawa ........ H01J 37/248
313/313

(Continued)

FOREIGN PATENT DOCUMENTS

JP      03-084839 A    4/1991
JP      04082150 A  *  3/1992    ............ H01J 37/067

(Continued)

*Primary Examiner* — Michael Logie
(74) *Attorney, Agent, or Firm* — Mattingly & Malur, PC

(57) ABSTRACT

An instrument producing a charged particle beam according to the present invention is provided with: a charged particle source; a plurality of first electrodes disposed along a direction of irradiation of charged particles from the charged particle source; a plurality of insulation members disposed between the first electrodes; and a housing mounted around the plurality of first electrodes. The housing is formed from an insulating solid material, and includes a plurality of second electrodes disposed at positions in proximity to the plurality of first electrodes. At least one of the plurality of second electrodes is electrically connected to at least one of the plurality of first electrodes, each of the plurality of second electrodes having the same potential as the potential of the proximate one of the first electrodes.

20 Claims, 6 Drawing Sheets

(51) Int. Cl.
  *H01J 37/02* (2006.01)
  *H01J 37/067* (2006.01)
  *H01J 37/248* (2006.01)
  *H01J 37/24* (2006.01)
  *H01J 27/02* (2006.01)
  *H01J 29/48* (2006.01)
  *H01J 37/16* (2006.01)

(52) U.S. Cl.
  CPC ............ *H01J 37/067* (2013.01); *H01J 37/073* (2013.01); *H01J 37/241* (2013.01); *H01J 37/248* (2013.01); *H01J 37/16* (2013.01); *H01J 2237/16* (2013.01)

(56) References Cited

U.S. PATENT DOCUMENTS

| | | | | |
|---|---|---|---|---|
| 4,032,810 A | * | 6/1977 | Eastham | H05H 5/02 313/360.1 |
| 4,642,461 A | * | 2/1987 | Endo | H01J 37/073 250/311 |
| 4,945,247 A | * | 7/1990 | Kawasaki | H01J 37/073 250/423 F |
| 5,059,859 A | * | 10/1991 | Endo | H01J 37/073 250/396 R |
| 5,463,268 A | * | 10/1995 | Schroeder | H01J 37/09 313/293 |
| 7,521,675 B2 | * | 4/2009 | Kawasaki | H01J 37/153 250/306 |
| 8,803,411 B2 | * | 8/2014 | Watanabe | H01J 37/073 313/441 |
| 2006/0175548 A1 | * | 8/2006 | Kawasaki | H01J 37/153 250/310 |
| 2009/0224701 A1 | * | 9/2009 | Morita | H01J 37/026 315/506 |
| 2009/0295269 A1 | * | 12/2009 | Morita | H01J 37/026 313/446 |
| 2012/0025741 A1 | * | 2/2012 | Morita | H01J 37/026 315/506 |
| 2012/0146554 A1 | * | 6/2012 | Smick | H02K 11/0094 315/506 |
| 2013/0140977 A1 | * | 6/2013 | Watanabe | H01J 37/073 313/460 |

FOREIGN PATENT DOCUMENTS

| | | |
|---|---|---|
| JP | 10-092363 A | 4/1998 |
| JP | 2006-216396 A | 8/2006 |
| JP | 2009-193896 A | 8/2009 |

* cited by examiner

US 9,548,182 B2

CHARGED PARTICLE BEAM GENERATING APPARATUS, CHARGED PARTICLE BEAM APPARATUS, HIGH VOLTAGE GENERATING APPARATUS, AND HIGH POTENTIAL APPARATUS

TECHNICAL FIELD

The present invention relates to a technology for insulating a high voltage system, and more specifically to an instrument producing a charged particle beam, a charged particle beam instrument, a high voltage generator, and a high electric potential instrument to which the technology is applied.

BACKGROUND ART

A charged particle beam instrument is an apparatus for accelerating particles (charged particles) having an electric charge, such as electrons or positive ions, using an electric field, and irradiating a specimen with the charged particles. The charged particle beam instrument performs observation, analysis, processing and the like of the specimen using an interaction of the specimen and the charged particles. Examples of the charged particle beam instrument include an electron microscope (EM), an electron beam lithography (EB) system, a focused ion beam (FIB) system, and an ion microscope (IM). Among those charged particle beam instruments, the electron microscope is an apparatus for performing observation of a microscopic structure or analysis of a constituent element by irradiating the specimen with electrons and detecting the interaction of the electrons and the specimen as a signal. In the following, the electron microscope will be described.

The electron microscope is often provided with an electron acceleration system using a negative high voltage potential. The electron microscope is provided with an electron source for producing free electrons in a vacuum. The electron microscope produces a flux of a number of electrons having a certain kinetic energy (electron beam) by accelerating the free electrons from the electron source using a potential difference. Most of electron microscopes have a structure such that, in order to obtain the electron beam, the electron source is placed at a cathode having a negative high voltage potential while placing an anode at ground level. The electrons are accelerated to desired energy by the potential difference between the cathode and the anode, producing the electron beam. The part of the electron microscope in which the electron beam is produced is called an electron gun. In many electron microscopes, the energy of the electron beam produced by the electron gun corresponds to the high voltage potential in the electron source portion of the electron gun.

Examples of the electron microscope include a scanning electron microscope (SEM), a scanning transmission electron microscope (STEM), and a transmission electron microscope (TEM). The scanning electron microscope is an apparatus that utilizes secondary electrons or back scattered electrons and the like from the specimen surface, and requires a maximum electron beam energy of approximately 30 kV.

The scanning transmission electron microscope and the transmission electron microscope are apparatuses that observe electrons transmitted through or scattered in the specimen, and typically require electron beam energy of 100 kV or more. As mentioned above, many of the electron microscopes have the structure where the electron beam energy is provided by a high voltage potential in the electron source portion. Thus, in an electron microscope that requires higher electron beam energy, it is necessary to insulate the high voltage potential of the electron source portion from the surrounding ground level portions so that the potential can be stably maintained.

Accordingly, in the electron gun having an acceleration voltage in excess of 100 kV, an accelerating tube structure is often adopted. In the accelerating tube structure, a structure (accelerating tube) comprising insulator tubes and metal rings alternately stacked one upon another is assembled between the electron source portion (cathode) which is maintained at a negative high voltage potential, and the anode which is an electron beam exit and which is at ground level. The accelerating tube structure is adopted, instead of directly connecting the electron source portion and the anode using a single insulator tube, for the following reasons. When there is a potential difference between the ends of a long insulator, instead of the contour lines of electric potential being smoothly distributed over the insulator between the electrodes on both ends, a portion with narrow intervals of the contour lines of electric potential (electric field concentrated portion) is created at a portion closer to one of the ends of the long insulator. In the electric field concentrated portion, electrical breakdown may be caused upon application of a high voltage. Thus, in the accelerating tube structure, a stacked structure of insulator tubes and interspace electrodes is adopted, and further the interspace electrodes are compulsorily given intermediate potentials between the electron source and the ground level using bleeder resistors. As a result, the insulator tubes only need to provide the function of insulating between the electrodes on both sides of the insulator tubes, whereby the high potential portion can be stably maintained.

Insulation of the accelerating tube structure will be considered. Between the accelerating tube and the surrounding ground level portions, there is a potential difference of a maximum of 200 kV, for example. The potential difference may cause a discharge in the space between the high potential portion of the accelerating tube and the ground level portion of a container. Thus, the electron gun requires the function of stably maintaining the potential difference (insulator portion).

Patent Literature 1 discloses a structure where the accelerating tube is surrounded by a metal container. In Patent Literature 1, the metal container is disposed around the accelerating tube and is set at ground level. In Patent Literature 1, in order to prevent discharge in the space between the high potential portion of the accelerating tube and the ground level portion of the container, the container is filled with gas insulator or liquid insulator. In this way, a discharge between electrodes having a potential difference is prevented.

CITATION LIST

Patent Literature

Patent Literature 1: JP 2006-216396 A

SUMMARY OF THE INVENTION

Technical Problem

In Patent Literature 1, gas insulator or liquid insulator (hereafter referred to as "insulator material") is used. The insulator material should have as high an insulating performance as possible so as to reduce the size, weight, and cost of the electron gun apparatus. As the gas insulator, $SF_6$ (sulfur hexafluoride) may be used. As the liquid insulator, rapeseed oil, fluorine inert liquid, or the like may be used. While these insulator materials have excellent insulating performance, $SF_6$ is a global warming gas of which limitation of the amount of use is demanded. However, there is hardly any other gas insulator which is more friendly to the environment than $SF_6$ while providing excellent insulating performance. Thus, there is a need for a structure that eliminates the use of, or decreases the amount of use of, gas insulator.

In the case of liquid insulator, such as rapeseed oil, the presence of bubbles would decrease insulating performance, making it difficult to open or close the apparatus. Thus, use of the liquid insulator in an apparatus that requires regular disassembly and maintenance, such as the electron gun, is difficult. In a method, the liquid insulator is substituted by an solid insulator, such as resin, with which areas around the accelerating tube are filled. Generally, the solid insulator can provide higher insulating performance than gas insulators or liquid insulators. However, once the solid insulator is filled and solidified, disassembly and maintenance become almost impossible.

Other than the electron gun, there are a number of high voltage systems provided with a number of stages of stacked electrode columns disposed between the high potential portion of the apparatus and the ground level portions, where the electrode columns are given successively intermediate potentials. Examples of the apparatus with such structure include Cockcroft-Walton type or Van de Graaff type high voltage generators, and static electric accelerating tubes for ion accelerators. These high voltage systems have the common technical problem of how to insulate the high potential portion as a whole from the surrounding container of the ground level. Thus, these high voltage systems are also associated with the above problem when a gas insulator or a liquid insulator is used.

The present invention provides a technology capable of increasing maintainability without using, or decreasing the amount of use of, gas or liquid insulator material in a high voltage system.

Solution to Problem

According to the present invention, there is provided an instrument producing a charged particle beam, the instrument including a charged particle source; a plurality of first electrodes disposed along a direction of irradiation of charged particles from the charged particle source; a plurality of insulation members disposed between the first electrodes; and a housing disposed around the plurality of first electrodes, in which the housing is formed from an insulating solid material, the housing includes a plurality of second electrodes mounted at positions in proximity to the plurality of first electrodes, and at least one of the plurality of second electrodes is electrically connected to at least one of the plurality of first electrodes, each of the plurality of second electrodes having the same potential as a potential of the proximate one of the first electrodes. Further, according to the present invention, there is provided a charged particle beam instrument including the instrument producing a charged particle beam.

According to the present invention, there is also provided a high voltage generator including a plurality of first electrodes stacked on a ground level surface; a plurality of insulation members disposed between the first electrodes; and a housing mounted around the plurality of first electrodes, in which the housing is formed from an insulating solid material, the housing includes a plurality of second electrodes mounted at positions in proximity to the plurality of first electrodes, and at least one of the plurality of second electrodes is electrically connected to at least one of the plurality of first electrodes, each of the plurality of second electrodes having the same potential as a potential of the proximate one of the first electrodes. Further, according to the present invention, there is provided a charged particle beam instrument including the high voltage generator.

According to the present invention, there is also provided a high electric potential instrument including a high potential portion in which a high potential is produced; at least one first electrode disposed between the high potential portion and a ground level surface; and a housing mounted around the high potential portion and the first electrode, in which the housing is formed from an insulating solid material, the housing includes a plurality of second electrodes disposed corresponding to predetermined potential intervals from the ground level surface to the high potential portion, and at least one of the plurality of second electrodes is electrically connected to the first electrode, each of the plurality of second electrodes having the same potential as each potential in the predetermined potential intervals.

Advantageous Effects of Invention

According to the present invention, it becomes possible, in a high voltage system, to eliminate the use of, or decrease the amount of use of, gas or liquid insulator material, and also maintainability is increased.

Additional features of the present invention will become apparent from the description in the present specification and the attached drawings. Other problems, configurations, and effects will become apparent from the following description of embodiments.

DESCRIPTION OF EMBODIMENTS

In the following, embodiments of the present invention will be described with reference to the attached drawings. It should be noted that while the attached drawings illustrate concrete embodiments and implementation examples in accordance with the principle of the present invention, these are for the sake of understanding of the present invention and are not to be taken as limiting the present invention.

First Embodiment

Figure 1:
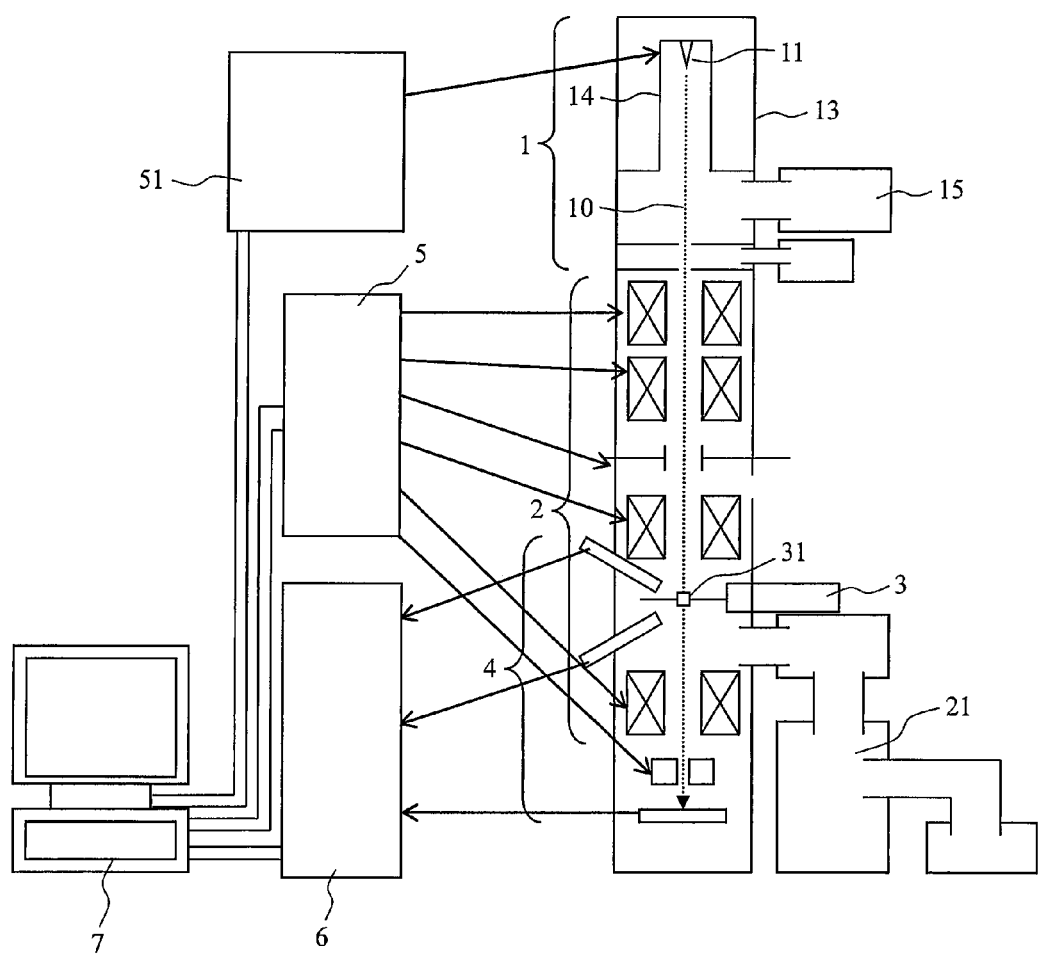
FIG. 1 is a conceptual diagram of an electron microscope provided with an electron gun according to a first embodiment of the present invention.

FIG. 1 is a conceptual diagram of an electron microscope provided with an electron gun according to a first embodiment of the present invention as an example of the charged particle beam instrument. The present invention is not limited to electron microscopes and may be applied to other charged particle beam instruments in which particles having an electric charge, such as electrons or positive ions (charged particles), emitted from a charged particle source are accelerated by an electric field and irradiated onto a specimen. Examples include an electron beam lithography system, a focused ion beam system, and an ion microscope.

As illustrated in FIG. 1, the electron microscope includes an electron gun 1, an electron optics system 2, a specimen holder 3, a detector 4, a power supply unit 5, a measurement unit 6, and an operation unit 7. The electron gun 1 includes an electron source 11, a housing 13, an accelerating tube 14, a vacuum pump 15, and a power supply 51. The power supply 51 supplies a high voltage potential to the electron source 11. The accelerating tube 14 is disposed along a direction of irradiation of electrons from the electron gun 1. The housing 13 is disposed around the accelerating tube 14 so as to insulate the high voltage potential of the electron source 11 from the surrounding areas. The vacuum pump 15 pumps the inside of the electron gun 1. In this configuration, the electron gun 1 emits electrons from the electron source 11 and accelerates the electrons through the accelerating tube 14, producing an electron beam 10.

The electron optics system 2 converges and deflects the electron beam 10, thereby irradiating the specimen 31 with the electron beam 10. The specimen holder 3 holds a specimen 31 and may be moved, inclined, or adapted to replace the specimen as needed. The detector 4 detects secondary electrons produced from the specimen 31, back scattered electrons, transmitted electrons, forward scattered electrons, X-ray or the like. The power supply unit 5 supplies power to the electron optics system 2, the specimen holder 3, and the detector 4. For example, the power supply unit 5 supplies power to the electron optics system 2 while adjusting output such that the electron beam 10 is controlled to a state requested by the operator. The electron optics system 2 is provided with a vacuum pump 21 for evacuating the inside of the electron optics system 2.

The measurement unit 6 converts information from the detector 4 into a digital signal. The operation unit 7 includes an information processing device, such as a computer. The operation unit 7 includes a CPU (not illustrated; which may also be referred to as an operating unit or a processor); a memory; a storage device (not illustrated), such as a HDD, or a ROM; an input/output device (not illustrated), such as a keyboard and a display; and a communication unit (not illustrated) that communicates with various constituent elements of the electron microscope. The operation unit 7 controls the electron gun 1 and the electron optics system 2 via the power supply unit 5, processes information from the measurement unit 6, and displays the information on the input/output device in a manner visible to the operator or records the information in the storage device.

Figure 2:
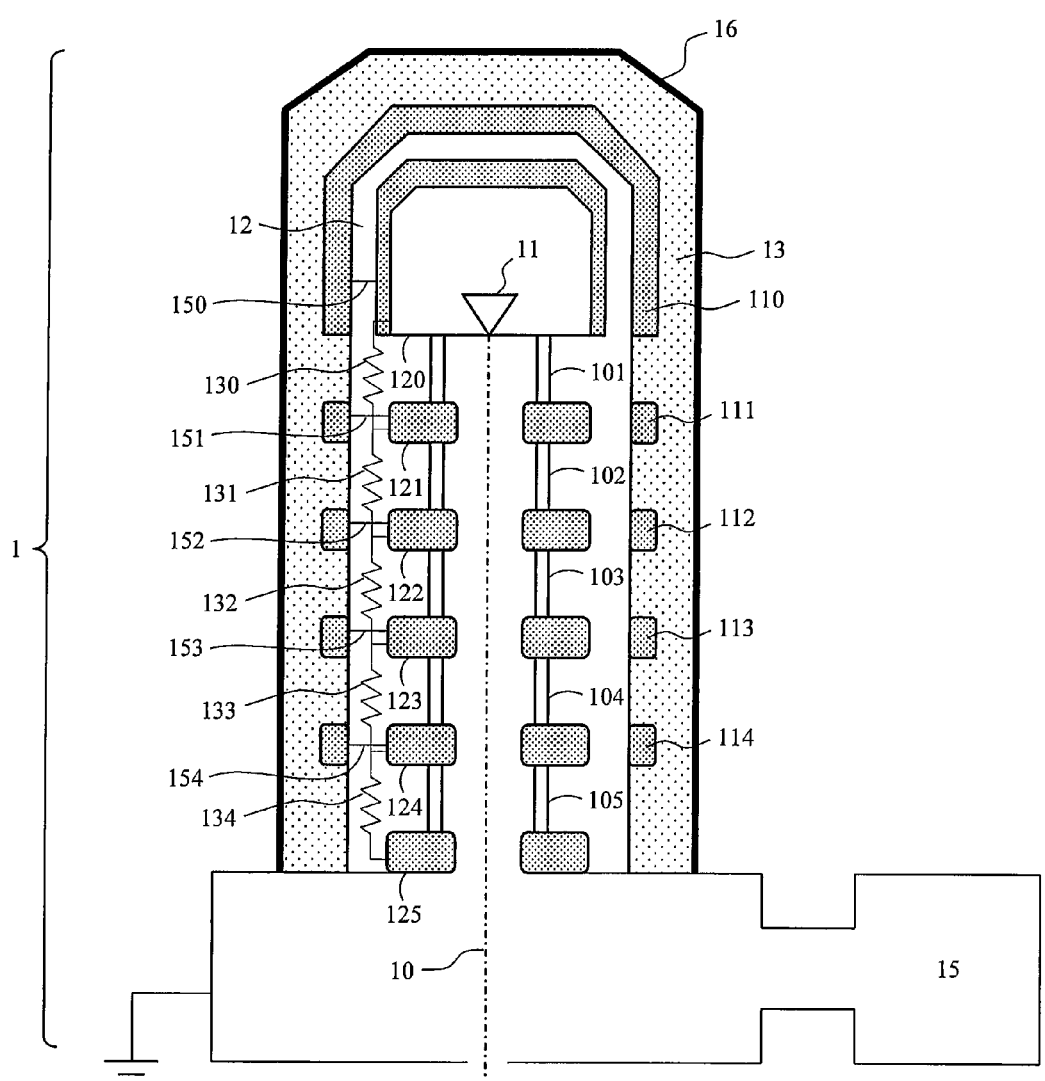
FIG. 2 is a lateral cross sectional view of the electron gun provided with an accelerating tube structure according to the first embodiment of the present invention.

FIG. 2 is a lateral cross sectional view of the electron gun provided with the accelerating tube according to the embodiment of the present invention. In FIG. 2, elements similar to those in FIG. 1 are designated with similar numerals. The electron gun 1 has a substantially axially symmetric structure with respect to the axis of the electron beam 10. The electron gun 1 is provided with a plurality of electrodes (121, 122, 123, 124) disposed along the direction of irradiation of electrons from the electron source 11, and with a plurality of insulator tubes (101, 102, 103, 104, 105) disposed between the plurality of electrodes. The plurality of electrodes (121, 122, 123, 124) and the plurality of insulator tubes (101, 102, 103, 104, 105) are alternately stacked between the electron source 11 and an anode 125 having ground level. The stacked structure as a whole will be referred to as an accelerating tube structure. At both ends of the accelerating tube structure, there are disposed a cathode 120 having approximately the same potential as the electron source 11 and the anode 125.

The electrodes (121, 122, 123, 124) stacked between the cathode 120 and the anode 125 are referred to as interspace electrodes. The cathode 120, the electrodes (121, 122, 123, 124), and the anode 125 are mutually connected via resistors (130, 131, 132, 133, 134). Through the resistors (130, 131, 132, 133, 134), a current corresponding to the potential between the cathode 120 and the anode 125 flows constantly. Thus, the resistors (130, 131, 132, 133, 134) function as bleeder resistors, dividing and maintaining the potentials of the electrodes (121, 122, 123, 124), i.e., the interspace electrodes, at equal intervals. For example, in an electron gun with the electron beam acceleration voltage of 200 kV, when a structure having four interspace electrodes (121, 122, 123, 124) is considered, the potentials given to the six electrodes including the cathode 120 and the anode 125 at both ends will be −200 kV, −160 kV, −120 kV, −80 kV, −40 kV, and 0 kV, respectively.

In the electron gun 1, the inside of the accelerating tube structure is maintained at a vacuum by the vacuum pump 15 so as to provide a passageway for the electron beam 10 produced from the electron source 11. The stacked electrodes (121, 122, 123, 124) function as interspace electrodes that provide the passing electron beam 10 with energy due to potential differences. The electron beam 10 produced from the electron source 11 are successively accelerated by the potentials of the interspace electrodes to the anode 125 in the accelerating tube structure.

According to the present embodiment, the accelerating tube structure is surrounded by the housing 13. As a feature of the present embodiment, the housing 13 is formed from an insulating solid material, such as a resin with high insulating performance. As the resin, conventional resins, such as epoxy resin, may be used. An outer surface 16 of the housing 13 is coated with electrically conductive paint for having ground level. On an inner surface of the resin housing 13, an intra-housing cathode 110 and a plurality of intra-housing electrodes (111, 112, 113, 114) are mounted. The intra-housing cathode 110 is mounted at a position opposite the cathode 120 in a direction orthogonal to the electron beam 10. The intra-housing electrodes (111, 112, 113, 114) are respectively mounted at positions opposite the electrodes (121, 122, 123, 124) in the orthogonal direction to the electron beam 10.

According to the present embodiment, the intra-housing cathode 110 corresponds to the cathode 120, and the intra-housing electrodes (111, 112, 113, 114) respectively correspond to the electrodes (121, 122, 123, 124). The corresponding electrodes are mutually connected by connection means (150, 151, 152, 153, 154), such as metal springs, with the housing 13 attached around the accelerating tube structure. Namely, when the housing 13 is attached around the accelerating tube structure, the cathode 120 and the intra-housing cathode 110 are mutually electrically connected, thus sharing the same potential. Also, the electrodes (121, 122, 123, 124) and the intra-housing electrodes (111, 112, 113, 114) are mutually electrically connected, whereby the corresponding electrodes have the same potentials. In this configuration, the portion of the resin housing 13 constitutes a portion with narrow intervals of the contour lines of electric potential (electric field concentrated portion), with the space 12 having a low electric field. Thus, the development of discharge between the high potential portion of the accelerating tube structure and the ground level surface of the housing 13 can be prevented by the resin having high breakdown voltage. Generally, resin is a substance with a high breakdown voltage compared with a vacuum, gas, or liquid. Thus, compared with the case where a vacuum, a gas insulator, or a liquid insulator is used for insulation, the distance between the high potential portion of the accelerating tube structure and the ground level surface of the housing 13 can be decreased, whereby the overall structure can be decreased in size.

In terms of preventing the discharge between the high potential portion of the accelerating tube structure and the ground level surface of the housing 13, the space between the ground level surface of the housing 13 (which is the outer surface 16 of the housing 13 according to the present embodiment) and the intra-housing cathode and the electrodes (110, 111, 112, 113, 114) may be filled with resin. Namely, the intra-housing cathode and the electrodes (110, 111, 112, 113, 114) need not be completely embedded in the housing 13 and instead may be partly exposed. For example, connecting locations of the intra-housing electrodes (111, 112, 113, 114) with the connection means (150, 151, 152, 153, 154) may be exposed.

While the intra-housing electrodes (111, 112, 113, 114) are respectively mounted at the positions opposite the electrodes (121, 122, 123, 124), an embodiment is not limited to this configuration. The electrodes (111, 112, 113, 114) may not necessarily be mounted at the opposite positions, and the intra-housing electrodes (111, 112, 113, 114) may respectively be mounted at positions in proximity to the electrodes (121, 122, 123, 124).

Figure 3:
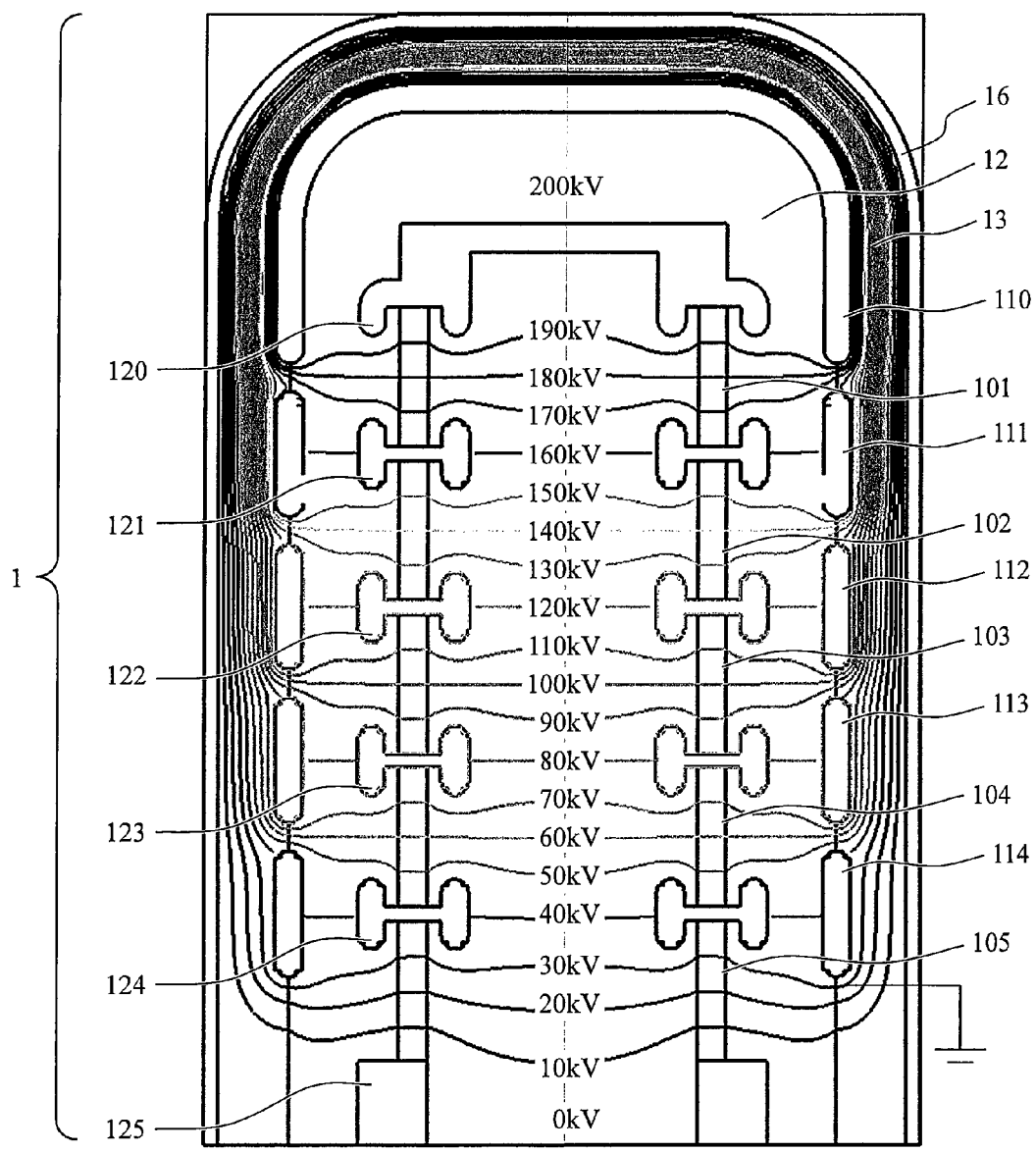
FIG. 3 is a diagram of an equipotential plane of the accelerating tube structure according to the first embodiment of the present invention.

FIG. 3 illustrates the contour lines of electric potential obtained when a high voltage is applied to the electron gun according to the present embodiment. In the example of FIG. 3, the electric potential contour line positions at 10 kV intervals were computed with the cathode 120 being fixed at 200 kV and the electrodes (121, 122, 123, 124), i.e., the interspace electrodes, being fixed at 160 kV, 120 kV, 80 kV, and 40 kV, respectively.

When the cathode 120 and the intra-housing cathode 110 have the same potential, and the corresponding electrodes of the electrodes (121, 122, 123, 124) and the intra-housing electrodes (111, 112, 113, 114) have the same potential, the contour lines of electric potential have narrower widths in the resin portion of the housing 13 and wider intervals in the portion of the space 12 between the housing 13 and the accelerating tube structure, as illustrated in FIG. 3. Namely, when the structure having the electrodes (the intra-housing electrodes and the intra-housing cathode) in the housing 13 is adopted, a high electric field is present in the resin portion of the housing 13 while a low electric field is present in the space 12. The space 12 between the housing 13 and the accelerating tube structure may be at a vacuum or atmospheric pressure, or sealed with gas insulator and the like.

According to the present embodiment, as illustrated in FIG. 3, in the space 12 between the housing 13 and the accelerating tube structure, there is only a weak electric field. Thus, an insulator material such as gas insulator may not be used in the space 12, or, when used, the amount of the gas insulator and the like may be decreased. Furthermore, because the space 12 is a gap between the resin housing 13 and the accelerating tube structure, the gap may be utilized for facilitating the attaching, detaching, or re-attaching of the housing 13, or for maintenance inside the electron gun.

Figure 4:
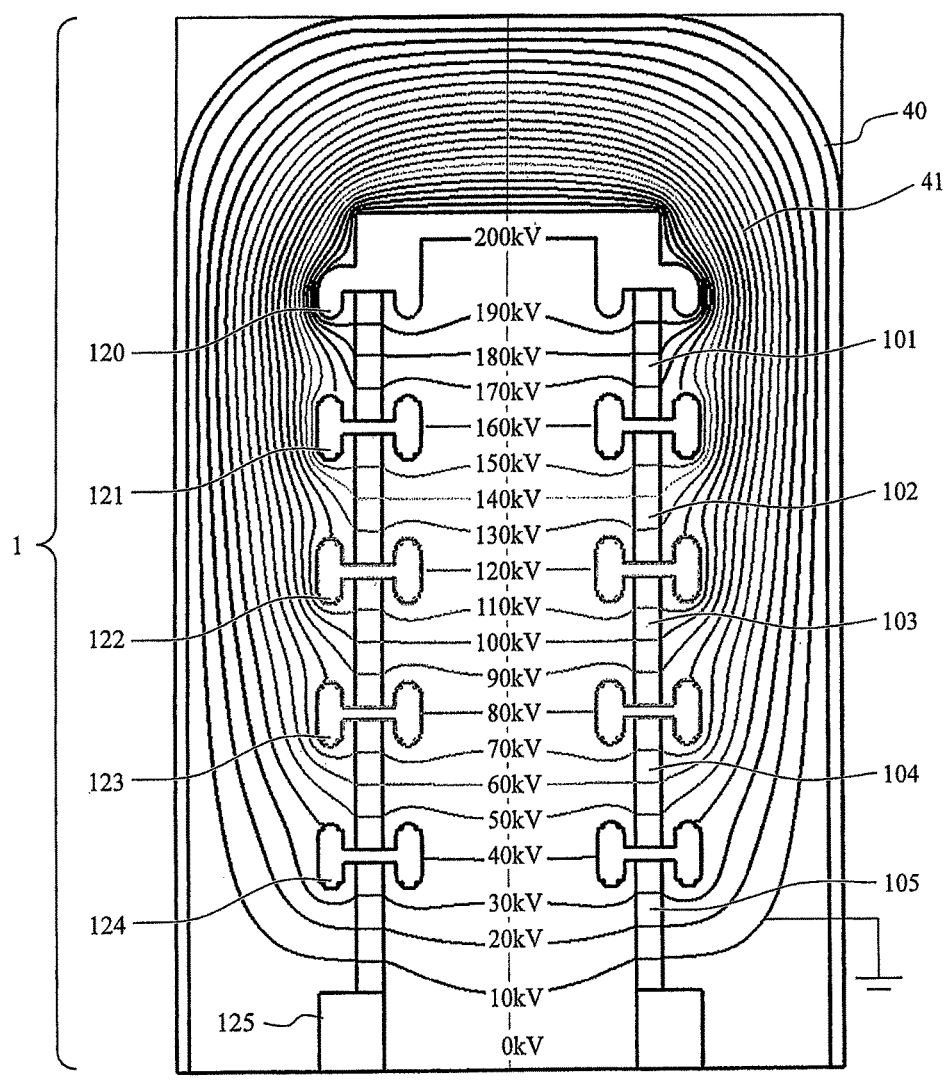
FIG. 4 is a diagram of an equipotential plane of an accelerating tube structure using a metal housing, which is a conventional structure.

FIG. 4 illustrates the contour lines of electric potential obtained when a high voltage is applied to the electron gun provided with a metal housing without the use of resin, in comparison to the present embodiment. In the electron gun of FIG. 4, the contour lines of electric potential are relatively uniformly distributed in the space between a metal housing 40 and the cathode 120 or the electrodes 121, 122, 123, and 124. In a space 41 between the accelerating tube structure and the housing 40, the intervals of the contour lines of electric potential are narrow compared with FIG. 3. This means that there is a strong electric field in the space 41. In order to resist electrical breakdown due to the strong electric field, the space 41 needs to be sealed with an insulator material, such as gas insulator or liquid insulator. In order to prevent discharge in the space between the high potential portion of the accelerating tube structure and the ground level of the housing 40, it is necessary to seal an insulator material such as gas insulator or liquid insulator in the space 41 while expanding the space. Thus, in the conventional metal housing structure illustrated in FIG. 4, the overall size of the electron gun is increased for expanding the space 41, thereby increasing the amount of the insulator material such as gas insulator or liquid insulator.

On the other hand, according to the present invention, no gas insulator or liquid insulator is used, as described above, or the amount of use of gas insulator can be decreased. In addition, resin generally is a substance with high breakdown voltage compared with vacuum, gas insulator, or liquid insulator. Thus, by narrowly designing the space between the ground level surface of the housing and the accelerating tube structure, and by providing a resin housing in the space, the overall structure of the electron gun can be decreased in size while preventing discharge.

Second Embodiment

Figure 5:
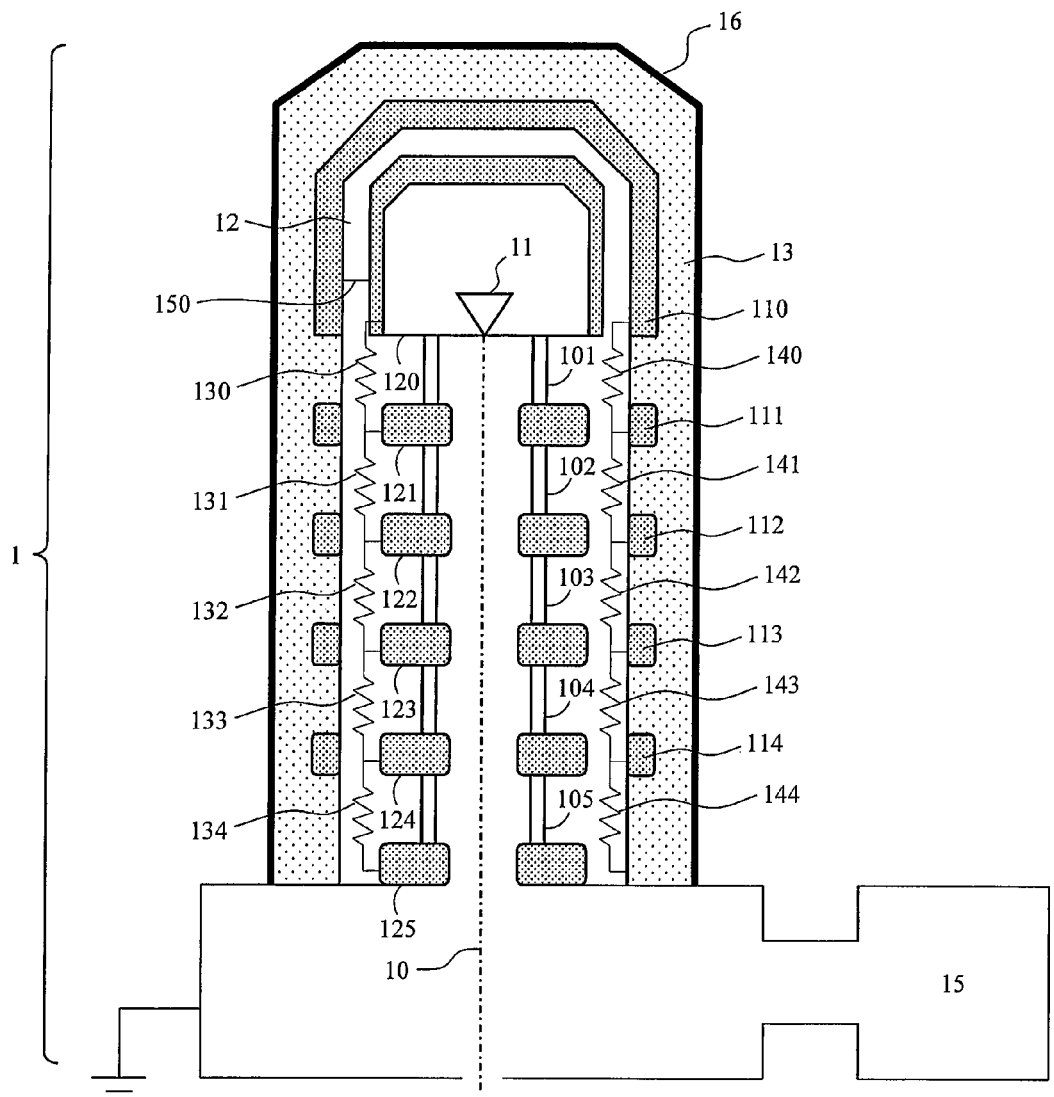
FIG. 5 is a conceptual diagram of an electron microscope provided with an electron gun according to a second embodiment of the present invention.

FIG. 5 is a lateral cross sectional view of the electron gun provided with the accelerating tube structure according to a second embodiment of the present invention. In FIG. 5, elements similar to those of FIG. 2 are designated with similar numerals, and their description will be omitted.

As illustrated in FIG. 5, the inner surface of the resin housing 13 is provided with the intra-housing cathode 110 and the plurality of intra-housing electrodes (111, 112, 113, 114). The second embodiment differs from the embodiment of FIG. 2 in that the intra-housing cathode 110 and the intra-housing electrodes (111, 112, 113, 114) are respectively connected by resistors (140, 141, 142, 143, 144). In the embodiment of FIG. 5, the intra-housing cathode 110 at the position with the largest potential difference with respect to the ground level is connected to the cathode 120 by a connection means 150, such as a metal spring.

The resistance of the resistors (140, 141, 142, 143, 144) are set such that the electrodes opposite each other have the same potential. For example, in the example of FIG. 5, the cathode 120, the electrodes (121, 122, 123, 124), and the anode 125 are given potentials of −200 kV, −160 kV, −120 kV, −80 kV, −40 kV, and 0 kV, respectively. The resistance of the resistor 140 is set such that the potential of the intra-housing electrode 111 is the same as the potential (−160 kV) of the opposite electrode 121. Similarly, the resistance of the remaining resistors (141, 142, 143, 144) is set such that the potential of each of the intra-housing electrodes (112, 113, 114) is the same as the potential of the opposite electrode (122, 123, 124).

In this configuration, the cathode 120 and the intra-housing cathode 110 have the same potential, and the corresponding electrodes of the electrodes (121, 122, 123, 124) and the intra-housing electrodes (111, 112, 113, 114) have the same potential. Thus, as in the example of FIG. 3, the portion of the resin housing 13 constitutes the portion with narrow intervals of the contour lines of electric potential (electric field concentrated portion), with the space 12 having a low electric field. Accordingly, the development of discharge in the space between the high potential portion of the accelerating tube structure and the ground level of the housing 13 can be prevented by the resin having high breakdown voltage. In addition, resin is generally a substance with high breakdown voltage compared with vacuum, gas, or liquid, so that the overall structure can be decreased in size compared with the case where gas insulator or liquid insulator is used for insulation.

According to the present embodiment, the intra-housing cathode 110 at the position with the largest potential difference with respect to ground level is connected to the opposite cathode 120 by the connection means 150. However, an embodiment is not limited to this configuration. For example, some of the intra-housing cathode 110 and the plurality of intra-housing electrodes (111, 112, 113, 114) (i.e., a plurality of electrodes) may be respectively connected to the opposite electrodes of the cathode 120 and electrodes (121, 122, 123, 124), with a plurality of intra-housing electrodes (111, 112, 113, 114) that are not connected to the opposite electrodes being connected by resistors.

For example, the intra-housing cathode 110 may be electrically connected to the opposite cathode 120, the intra-housing electrode 111 may be electrically connected to the electrode 121, and the remaining intra-housing electrodes (112, 113, 114) may be connected by a plurality of resistors.

Third Embodiment

Figure 6:
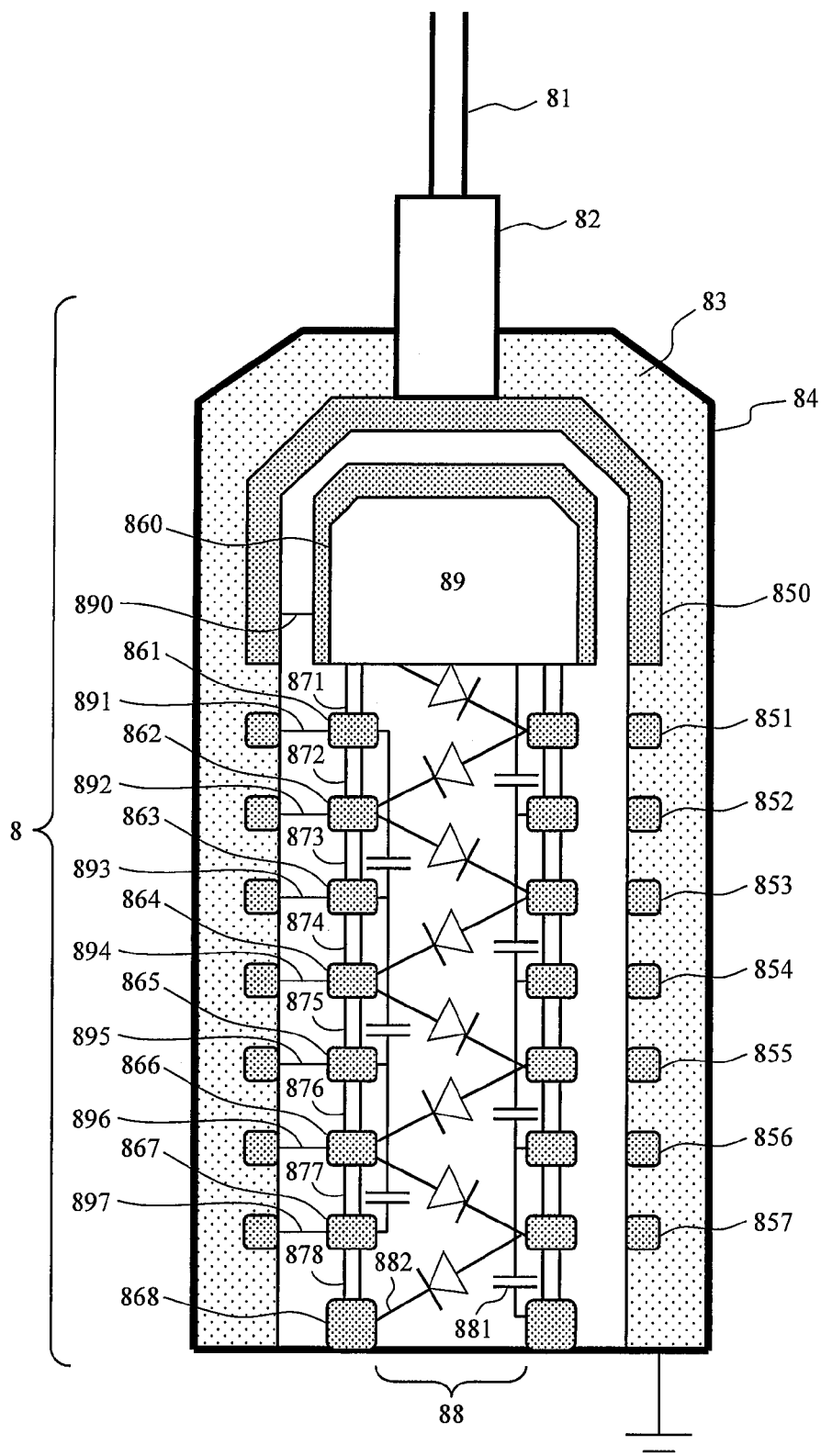
FIG. 6 is a lateral cross sectional view of a high voltage generator according to a third embodiment of the present invention.

FIG. 6 is a lateral cross sectional view of a high voltage generator according to a third embodiment of the present invention. The present invention may be similarly utilized in high voltage systems other than electron guns and still provide similar effects. FIG. 6 is a cross section view of a Cockcroft-Walton type high voltage generator 8 as an example of the high voltage system. The high voltage generator 8 is a high voltage power supply generator included in the power supply 51 of the electron microscope illustrated in FIG. 1.

The high voltage generator 8 has a structure such that electrodes (867, 866, 865, 864, 863, 862, 861, 860) and insulators (878, 877, 876, 875, 874, 873, 872, 871) are alternately stacked on a ground electrode 868 which is grounded. The electrodes (867, 866, 865, 864, 863, 862, 861, 860) are mutually electrically connected by a Cockcroft-Walton circuit 88. The Cockcroft-Walton circuit 88 is a circuit comprising high-withstand voltage capacitors 881 and diodes 882 repeatedly connected in a predetermined order. In the high voltage generator 8, an alternating current voltage is applied to the ground electrode 868 by an alternating current power supply which is not illustrated, whereby the voltages of the electrodes (867, 866, 865, 864, 863, 862, 861, 860) are successively increased, enabling the electrode 860 and an internal circuit portion 89 to generate a high voltage.

The electrode 860 and the internal circuit portion 89 are connected to a high voltage (HV) cable 81 via a connector 82. The high voltage generated by the electrode 860 and the internal circuit portion (high voltage producing portion) 89 are transmitted via the connector 82 and the high voltage cable 81 to an apparatus, such as the electron gun 1, from the high voltage generator 8. The electrode columns (867, 866, 865, 864, 863, 862, 861, 860) are surrounded by a resin housing 83. An outer surface 84 of the housing 83 is coated with electrically conductive paint and connected to ground level. An inner surface of the housing 83 is provided with intra-housing electrodes (850, 851, 852, 853, 854, 855, 856, 857). The intra-housing electrodes (850, 851, 852, 853, 854, 855, 856, 857) are respectively mounted at positions opposite the electrodes (860, 861, 862, 863, 864, 865, 866, 867) in an orthogonal direction with respect to the direction in which the electrodes (860 to 867) are stacked.

The opposite electrodes of the intra-housing electrodes (850 to 857) and the electrodes (867 to 860) are mutually connected by connection means (890, 891, 892, 893, 894, 895, 896, 897), such as metal springs. Thus, the opposite electrodes are electrically connected and provided with the same potentials. In this configuration, as in the case of the electron gun 1 of FIG. 2 or FIG. 3, a high electric field due to a high voltage is generated in the resin housing 83. Namely, for the high voltage generator 8, a structure that can eliminate the need for, or decrease the amount of use of, gas insulator and the like can be obtained. Conventionally, a high voltage generator that uses gas insulator or liquid insulator and the like is discarded in the event of failure or the like. In contrast, the structure provided with the resin housing 83 enables disassembly or internal maintenance of the high voltage generator.

According to the present embodiment, an application example of the present invention has been described with reference to the Cockcroft-Walton type high voltage generator. However, the present invention is not limited to the application example. For example, the present invention may be applied to other high voltage generators, such as one of the Van de Graaff type.

CONCLUSION

According to the first embodiment, the electron gun 1 is provided with the electron source 11 that emits electrons, the cathode 120, the anode 125, the plurality of electrodes (121, 122, 123, 124), the plurality of insulator tubes (101, 102, 103, 104, 105), and the housing 13 disposed around the plurality of electrodes (121, 122, 123, 124). The housing 13 is formed of insulating resin and provided with the intra-housing cathode 110 mounted at the position opposite the cathode 120, and the plurality of intra-housing electrodes (111, 112, 113, 114) mounted at the positions opposite the plurality of electrodes (121, 122, 123, 124). The intra-housing cathode and electrodes (110, 111, 112, 113, 114) are respectively connected to the opposite electrodes (120, 121, 122, 123, 124) by the connection means (150, 151, 152, 153, 154) such as metal springs. Thus, the opposite electrodes have the same potential.

In this configuration, the portion of the resin housing 13 constitutes the portion (electric field concentrated portion) with narrow intervals of the contour lines of electric potential, with the space 12 having a low electric field. Accordingly, the development of discharge in the space between the high potential portion of the accelerating tube structure and the ground level of the housing 13 can be prevented by the resin having high breakdown voltage. Furthermore, because resin is generally a substance with high breakdown voltage compared with vacuum, gas, or liquid, a large potential difference can be stably retained while decreasing the distance between the housing 13 and the accelerating tube structure, compared with the case where vacuum, gas insulator, or liquid insulator is used for insulation. Thus, the distance between the housing 13 and the accelerating tube structure can be decreased, enabling further decrease in the size, weight, and cost of the electron gun 1. The housing 13 can be easily detached from around the accelerating tube structure, and then attached around the accelerating tube structure. Accordingly, maintenance inside the electron gun can be easily performed.

According to the second embodiment, the inner surface of the housing 13 is provided with the intra-housing cathode 110 and the plurality of intra-housing electrodes (111, 112, 113, 114). The intra-housing cathode 110 is connected to the cathode 120 by the connection means 150, such as a metal spring, and the intra-housing cathode 110 and the intra-housing electrodes (111, 112, 113, 114) are respectively connected by the resistors (140, 141, 142, 143, 144). The resistance of the resistors (140, 141, 142, 143, 144) are set such that the mutually opposite electrodes have the same potential.

According to this configuration, the mutually opposite electrodes can have the same potential without electrically connecting all of the opposite electrodes by connection means and the like. Thus, the portion of the resin housing 13 constitutes the portion (electric field concentrated portion) with narrow intervals of the contour lines of electric potential, with the space 12 having a low electric field. Accordingly, the development of discharge in the space between the high potential portion of the accelerating tube structure and the ground level of the housing 13 can be prevented by the resin having high breakdown voltage. Further, because resin is generally a substance with high breakdown voltage compared with vacuum, gas, or liquid, the overall structure can be decreased in size compared with the case where gas insulator or liquid insulator is used for insulation.

According to the third embodiment, the Cockcroft-Walton type high voltage generator 8 has the structure in which the plurality of electrodes (867, 866, 865, 864, 863, 862, 861, 860) and the plurality of insulators (878, 877, 876, 875, 874, 873, 872, 871) are stacked on the ground electrode 868, which is grounded, the stacked structure being surrounded by the housing 83. The housing 83 is provided with the plurality of intra-housing electrodes (850, 851, 852, 853, 854, 855, 856, 857) opposite the plurality of electrode columns (867, 866, 865, 864, 863, 862, 861, 860). The plurality of intra-housing electrodes (850, 851, 852, 853, 854, 855, 856, 857) are respectively connected to the opposite electrodes (867, 866, 865, 864, 863, 862, 861, 860) by the connection means (890, 891, 892, 893, 894, 895, 896, 897). Thus, the opposite electrodes are electrically connected and have the same potential.

In this configuration, a high electric field due to the generated high voltage is produced in the resin housing 83, whereby the development of discharge in the space between the high potential portion of the high voltage generator 8 and the ground level of the housing 83 can be prevented. Further, because resin is generally a substance with high breakdown voltage compared with vacuum, gas, or liquid, the overall structure can be further decreased in size compared with the case of using gas insulator or liquid insulator for insulation. Conventionally, a high voltage generator that uses gas insulator or liquid insulator is discarded in the event of failure and the like. In contrast, the mounting of the resin housing 83 enables disassembly or internal maintenance of the high voltage generator.

The present invention is not limited to the foregoing embodiments and may include various modifications. The foregoing embodiments have been described for aiding an understanding of the present invention, and may not include all of the described configurations. A part of the configuration of one embodiment may be substituted by the configuration of another embodiment, or the configuration of the other embodiment may be incorporated into the configuration of the one embodiment. With respect to a part of the configuration of each embodiment, addition, deletion, or substitution of other configurations may be made.

For example, while in the foregoing embodiments, all of the electrodes are provided with the intra-housing electrodes at the opposite positions, the present invention is not limited to such configuration. For example, the number of the intra-housing electrodes may be decreased. For example, every other of a plurality of electrodes may be provided with the intra-housing electrodes. In this way, the manufacturing cost for the apparatus can be contained while preventing the development of discharge in the space between the high potential portion and the ground level of the housing.

In the first through third embodiments, an application example of the present invention has been described with reference to the electron gun equipped with the accelerating tube structure and the Cockcroft-Walton type high voltage generator. However, the present invention is not limited to such application example. For example, the present invention may be applied to a general high electric potential instrument having an internal high potential portion, with a housing mounted around the high potential portion. One example is an accelerator unit of a synchrotron accelerator. In this case, the high electric potential instrument is provided with a high potential portion in which a high potential is produced, at least one first electrode disposed between the high potential portion and a ground level surface, and a housing disposed around the high potential portion and the first electrode. The housing may be formed from an insulating solid material such as resin, and may be provided with a plurality of second electrodes disposed corresponding to predetermined potential intervals from the ground level surface to the high potential portion, with at least one of the plurality of second electrodes being electrically connected to the first electrode, and each of the plurality of second electrodes having a potential equal to each potential in the predetermined potential intervals.

The present invention may also be applied to a high electric potential instrument having a stacked structure including electrodes and an insulation member between a high potential portion and a ground level portion. To an apparatus in which the interspace electrodes of the stacked structure have intermediate potentials between the high potential portion of the apparatus and the ground level, a structure similar to the resin housing provided with the above-described intra-housing electrodes may be applied. Thus, a high electric potential instrument can be obtained that eliminates the use of, or decreases the amount of use of, gas insulator and the like.

The control lines or information lines in the drawings are only those considered necessary for descriptive purposes, and they do not necessarily represent all of the control lines or information lines required in a product. All of the configurations may be mutually connected.

REFERENCE SIGNS LIST

1 Electron gun
2 Electron optics system

3 Specimen holder
4 Detector
5 Power supply unit
6 Measurement unit
7 Operation unit
8 High voltage generator
10 Electron beam
11 Electron source
13 Housing
14 Accelerating tube
15 Vacuum pump
21 Vacuum pump
31 Specimen
51 Power supply
110 Intra-housing cathode (second electrode)
111 to 114 Intra-housing electrode (second electrode)
120 Cathode (first electrode)
121 to 124 Electrode (first electrode)
125 Anode (first electrode)
140 to 144 Resistor
150 to 154 Connection means
81 High voltage cable
82 Connector
83 Housing
88 Cockcroft-Walton circuit
89 Circuit portion
860 Electrode
868 Ground electrode
881 Capacitor
882 Diode

The invention claimed is:

1. An instrument producing a charged particle beam, the instrument comprising:
 a charged particle source;
 a plurality of first electrodes disposed along a direction of irradiation of charged particles from the charged particle source between an anode having a ground potential and a first cathode;
 a plurality of insulation members disposed between the plurality of first electrodes; and
 a housing which covers the plurality of first electrodes and the charged particle source,
 wherein the first cathode, the anode, and the plurality of first electrodes are mutually connected via first resistors,
 wherein the housing is formed from an insulating solid material and has an inner surface which is disposed to surround the charged particle source, the first cathode, the anode, and the plurality of first electrodes,
 wherein the housing includes a plurality of second electrodes mounted to the inner surface of the housing at positions in proximity to the plurality of first electrodes, and includes a second cathode mounted on the inner surface of the housing at a position opposite to the first cathode in a direction orthogonal to the direction of irradiation of the charged particles, and the second cathode is connected to have the same potential as the potential of the first cathode, and
 wherein at least one of the plurality of second electrodes is electrically connected to at least one of the plurality of first electrodes, each of the plurality of second electrodes having the same potential as the potential of the proximate one of the plurality of first electrodes.

2. The instrument producing a charged particle beam according to claim 1, wherein a gap between a ground level surface of the housing and the plurality of second electrodes mounted to the inner surface of the housing is filled with the insulating solid material.

3. The instrument producing a charged particle beam according to claim 1, wherein each of the plurality of second electrodes is mounted to the inner surface of the housing at a position opposite the proximate one of the plurality of first electrodes in the direction orthogonal to the direction of irradiation of the charged particles.

4. The instrument producing a charged particle beam according to claim 1, wherein each of the plurality of second electrodes mounted to the inner surface of the housing is electrically connected to the proximate one of the plurality of first electrodes, each of the plurality of second electrodes having the same potential as the potential of the proximate one of the plurality of first electrodes.

5. The instrument producing a charged particle beam according to claim 1, wherein a first one of the plurality of first electrodes located at a position with the largest potential difference with respect to the ground potential and a first one of the plurality of second electrodes mounted to the inner surface of the housing and located in proximity to the first one of the plurality of first electrodes are electrically connected, the plurality of second electrodes being connected by a plurality of second resistors, and each of the plurality of second electrodes has the same potential as the potential of the proximate one of the plurality of first electrodes.

6. The instrument producing a charged particle beam according to claim 1, wherein some of the plurality of first electrodes and some of the plurality of second electrodes mounted to the inner surface of the housing and in proximity to the plurality of first electrodes are respectively electrically connected, second electrodes of the plurality of second electrodes that are not connected to the plurality of first electrodes are connected by a plurality of second resistors, and each of the plurality of second electrodes has the same potential as the potential of the proximate one of the plurality of first electrodes.

7. The instrument producing a charged particle beam according to claim 1,
 wherein the second cathode and the plurality of second resistors are connected via a plurality of second resistors.

8. The instrument producing a charged particle beam according to claim 1,
 wherein the plurality of first electrodes are mutually connected by a Cockcroft-Walton circuit, which includes a plurality of diodes and a plurality of capacitors.

9. A charged particle beam instrument comprising:
 an instrument producing a charged particle beam, the instrument comprising:
 a charged particle source;
 a plurality of first electrodes disposed along a direction of irradiation of charged particles from the charged particle source between an anode having a ground potential and a first cathode;
 a plurality of insulation members disposed between the plurality of first electrodes; and
 a housing which covers the plurality of first electrodes, and the charged particle source;
 wherein the first cathode, the anode, and the plurality of first electrodes are mutually connected via first resistors,
 wherein the housing is formed from an insulating solid material and has an inner surface which is disposed to surround the charged particle source, the first cathode, the anode, and the plurality of first electrodes, and wherein the housing includes a plurality of second electrodes mounted to the inner surface of the housing at positions in proximity to the plurality of first electrodes, and includes a second cathode mounted on the inner surface of the housing at a position opposite to the first cathode in a direction orthogonal to the direction of irradiation of the charged particles, and the second cathode is connected to have the same potential as the potential of the first cathode, and wherein at least one of the plurality of second electrodes is electrically connected to at least one of the plurality of first electrodes, each of the plurality of second electrodes having the same potential as the potential of the proximate one of the plurality of first electrodes.

10. The charged particle beam instrument according to claim 9,
wherein the second cathode and the plurality of second resistors are connected via a plurality of second resistors.

11. The charged particle beam instrument according to claim 9,
wherein the plurality of first electrodes are mutually connected by a Cockcroft-Walton circuit, which includes a plurality of diodes and a plurality of capacitors.

12. A high voltage generator comprising:
a plurality of first electrodes stacked between an anode having a ground potential and a first cathode;
a plurality of insulation members disposed between the plurality of first electrodes; and
a housing which covers the plurality of first electrodes and a high potential portion of the high voltage generator,
wherein the first cathode, the anode, and the plurality of first electrodes are mutually connected via first resistors,
wherein the housing is formed from an insulating solid material and has an inner surface which is disposed to surround the charged particle source, the first cathode, the anode, and the plurality of first electrodes,
wherein the housing includes a plurality of second electrodes mounted to the inner surface of the housing at positions in proximity to the plurality of first electrodes, and includes a second cathode mounted on the inner surface of the housing at a position opposite to the first cathode in a direction orthogonal to a direction that the plurality of first electrodes are stacked, the second cathode is connected to have the same potential as the potential of the first cathode, and
wherein at least one of the plurality of second electrodes is electrically connected to at least one of the plurality of first electrodes, each of the plurality of second electrodes having the same potential as a potential of the proximate one of the plurality of first electrodes.

13. The high voltage generator according to claim 12, wherein a gap between the ground level surface of the housing and the plurality of second electrodes mounted to the inner surface of the housing is filled with the insulating solid material.

14. The high voltage generator according to claim 12, wherein each of the plurality of second electrodes is mounted to the inner surface of the housing at a position opposite the proximate one of the plurality of first electrodes in the direction orthogonal to the direction in which the plurality of first electrodes are stacked.

15. The high voltage generator according to claim 12, wherein each of the plurality of second electrodes mounted to the inner surface of the housing is electrically connected to the proximate one of the plurality of first electrodes, each of the plurality of second electrodes having the same potential as the potential of the proximate one of the plurality of first electrodes.

16. The high voltage generator according to claim 12, wherein a first one of the plurality of first electrodes having the largest potential difference with respect to a ground potential and a first one of the plurality of second electrodes mounted to the inner surface of the housing and in proximity to the first one of the plurality of first electrodes are electrically connected, the plurality of second electrodes are connected by a plurality of second resistors, and each of the plurality of second electrodes has the same potential as the potential of the proximate one of the plurality of first electrodes.

17. The high voltage generator according to claim 12, wherein some of the plurality of first electrodes and some of the plurality of second electrodes mounted to the inner surface of the housing in proximity to the plurality of first electrodes are respectively electrically connected, and the plurality of second electrodes that are not connected to the plurality of first electrodes are connected by a plurality of second resistors, each of the plurality of second electrodes having the same potential as the potential of the proximate one of the plurality of first electrodes.

18. A charged particle beam instrument comprising the high voltage generator according to claim 12.

19. The high voltage generator according to claim 12,
wherein the second cathode and the plurality of second resistors are connected via a plurality of second resistors.

20. A high electric potential instrument comprising:
a high potential portion in which a high potential is produced;
at least one first electrode disposed between a first cathode and an anode having a ground potential; and
a housing which covers the high potential portion, and the at least one first electrode,
wherein the first cathode, the anode, and the plurality of first electrodes are mutually connected via first resistors,
wherein the housing is formed from an insulating solid material and has an inner surface which is disposed to surround the high potential portion, the at least one first electrode, the first cathode, and the anode,
wherein the housing includes a plurality of second electrodes mounted to the inner surface of the housing and corresponding to predetermined potential intervals from the ground level surface to the high potential portion, and includes a second cathode mounted on the inner surface of the housing at a position opposite to the first cathode in a direction orthogonal to a direction that the plurality of first electrodes are stacked, and the second cathode is connected to have the same potential as the potential of the first cathode, and
wherein at least one of the plurality of second electrodes is electrically connected to the at least one first electrode, each of the plurality of second electrodes having the same potential as each potential in the predetermined potential intervals.

* * * * *